(12) United States Patent
Shi et al.

(10) Patent No.: US 12,002,618 B2
(45) Date of Patent: Jun. 4, 2024

(54) TRANSFORMER

(71) Applicant: HUAWEI TECHNOLOGIES CO., LTD., Shenzhen (CN)

(72) Inventors: Kai Shi, Shanghai (CN); Lei Lu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 467 days.

(21) Appl. No.: 16/901,281

(22) Filed: Jun. 15, 2020

(65) Prior Publication Data

US 2020/0312540 A1    Oct. 1, 2020

Related U.S. Application Data

(63) Continuation of application No. PCT/CN2017/119102, filed on Dec. 27, 2017.

(51) Int. Cl.
| | |
|---|---|
| *H01F 27/28* | (2006.01) |
| *H01F 27/06* | (2006.01) |
| *H01F 27/40* | (2006.01) |
| *H01F 30/06* | (2006.01) |
| *H01L 23/64* | (2006.01) |

(52) U.S. Cl.
CPC .............. *H01F 30/06* (2013.01); *H01F 27/06* (2013.01); *H01F 27/28* (2013.01); *H01F 27/40* (2013.01); *H01L 23/645* (2013.01)

(58) Field of Classification Search
CPC ......... H01F 27/2804; H01F 2027/2809; H01F 17/0013; H01F 17/0006; H01F 5/003; H01F 30/06; H01F 27/06; H01F 27/28; H01F 27/40; H01L 23/645

USPC .................................................. 336/200, 232
See application file for complete search history.

(56) References Cited

U.S. PATENT DOCUMENTS

| | | | | |
|---|---|---|---|---|
| 8,427,388 | B2 * | 4/2013 | Fahs ........................ | H01P 5/10 343/859 |
| 8,937,523 | B1 * | 1/2015 | Ho .......................... | H03F 3/211 336/200 |
| 2010/0019857 | A1 * | 1/2010 | McMorrow .............. | H03H 7/38 333/32 |
| 2010/0019858 | A1 * | 1/2010 | McMorrow ......... | H03F 3/45475 336/200 |

(Continued)

FOREIGN PATENT DOCUMENTS

| | | |
|---|---|---|
| CN | 104584152 A | 4/2015 |
| CN | 106030730 A | 10/2016 |

(Continued)

*Primary Examiner* — Tszfung J Chan
(74) *Attorney, Agent, or Firm* — Slater Matsil, LLP

(57) ABSTRACT

A transformer, including a first coil and a second coil. The first coil is magnetically coupled to the second coil. At least one of the first coil and the second coil includes a plurality of sub-coils, and the plurality of sub-coils include a first sub-coil and a second sub-coil. A first magnetic field formed by the first sub-coil passes through a layout plane of the transformer in a first manner, and a second magnetic field formed by the second sub-coil passes through the layout plane in a second manner. The first manner includes passing in from a first surface of the layout plane and passing out from a second surface of the layout plane, and the second manner includes passing in from the second surface and passing out from the first surface.

18 Claims, 9 Drawing Sheets

(56) References Cited

U.S. PATENT DOCUMENTS

| | | | | |
|---|---|---|---|---|
| 2010/0109793 A1* | 5/2010 | Endo | ................... | H01F 27/2804 333/26 |
| 2012/0242406 A1* | 9/2012 | Ke | ...................... | H01F 27/2804 330/195 |
| 2014/0077919 A1* | 3/2014 | Godoy | ................. | H01F 27/006 336/226 |
| 2014/0354371 A1* | 12/2014 | Tsai | ....................... | H01F 19/04 333/131 |
| 2015/0065068 A1* | 3/2015 | Mattsson | ............ | H01F 27/2804 336/200 |
| 2015/0170824 A1* | 6/2015 | Tesson | ................ | H01F 27/2804 336/190 |
| 2015/0206634 A1 | 7/2015 | Yan et al. | | |
| 2017/0012601 A1* | 1/2017 | Yen | ..................... | H01L 23/5227 |

FOREIGN PATENT DOCUMENTS

| | | | |
|---|---|---|---|
| CN | 106298190 A | 1/2017 | |
| CN | 106504869 A | 3/2017 | |
| CN | 106571211 A | 4/2017 | |
| CN | 106710847 A | 5/2017 | |
| CN | 107146700 A | 9/2017 | |
| WO | 9805048 A1 | 2/1998 | |
| WO | WO-2015109183 A1 * | 7/2015 | ......... H01F 17/0006 |

\* cited by examiner

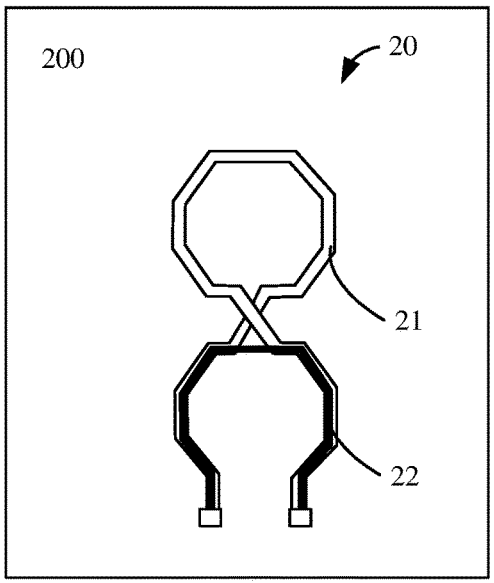
FIG. 13
| Performance<br>Structure | First coil inductance value (pH) @ 12 GHz | Second coil inductance value (pH) @ 12 GHz | First coil quality factor @ 12 GHz | Second coil quality factor @ 12 GHz | Coupling coefficient @ 12 GHz |
|---|---|---|---|---|---|
| Transformer 10 | 378.9 | 166 | 10 | 9 | 0.55 |
| Transformer 20 | 218 | 80 | 20 | 16 | 0.72 |
FIG. 14
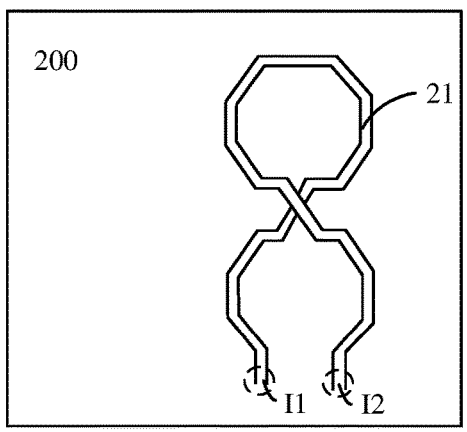
FIG. 15

Cross structure     Two-cross structure     Three-cross structure

✗ A direction of a first magnetic filed is downward

● A direction of a second magnetic filed is upward

TRANSFORMER

CROSS-REFERENCE TO RELATED APPLICATIONS

This application is a continuation of International Application No. PCT/CN2017/119102, filed on Dec. 27, 2017, the disclosure of which is hereby incorporated by reference in its entirety.

TECHNICAL FIELD

This application relates to the field of electronic technologies, and in particular, to a transformer

BACKGROUND

In various circuit systems, a transformer is a common device, and can be configured to implement functions such as voltage drop, voltage boost, electrical signal coupling, energy transfer, impedance conversion, impedance matching, and isolation. For example, in an integrated circuit, a transformer and another device are integrated into a same chip. Limited by a technology, performance of an integrated transformer is poorer than that of a discrete device. Therefore, how to improve performance of a transformer is very important.

FIG. 1 is a schematic structural diagram of a layout of a transformer 10 in the prior art. The transformer 10 is shown on a layout plane 100 shown in FIG. 1, and the transformer 10 includes a coil 11 and a coil 12 that are magnetically coupled to each other. It is assumed that the coil 11 is a primary coil, the coil 12 is a secondary coil, the primary coil 11 includes two input ports I1 and I2, and the secondary coil 12 includes two output ports O1 and O2. The primary coil 11 includes two sub-coils 11A and 11B that are coupled by using a cross structure. Along a direction perpendicular to the layout plane 100, that is, from the perspective of a top view, the sub-coil 11A surrounds the sub-coil 11B, to be specific, the two mutually coupled sub-coils 11A and 11B are of a spiral structure. It is assumed that a current in the primary coil 11 flows in from the port I1 and flows out from the port I2, and a current in the secondary coil 12 flows in from the port O2 and flows out from the port O1. In this case, for the primary coil 11, the sub-coil 11A generates, in an area surrounded by the sub-coil 11A, a first magnetic field that is perpendicular to the layout plane 100 and that is in a downward direction, and the sub-coil 11B generates, in an area surrounded by the sub-coil 11B, a second magnetic field that is perpendicular to the layout plane 100 and that is in a downward direction. Because the first magnetic field and the second magnetic field are in the same direction, a superposed magnetic field is formed, and interference is caused to a circuit system.

In the current system, because any coil of a transformer is usually of a spiral structure, a superposed magnetic field generated by different sub-coils inside the transformer is considered as an interference magnetic field. This may impose adverse impact on working of the transformer or another device. Especially when the transformer works at a high frequency or a radio frequency, this impact is more serious.

SUMMARY

Embodiments of this application provide an improved transformer, to suppress an interference magnetic field generated by a conventional transformer.

In view of this, a first aspect of this application provides a transformer, including a first coil and a second coil. The first coil is magnetically coupled to the second coil. At least one of the first coil and the second coil includes a plurality of sub-coils, the plurality of sub-coils include a first sub-coil and a second sub-coil, a first magnetic field formed by the first sub-coil passes through a layout plane of the transformer in a first manner, a second magnetic field formed by the second sub-coil passes through the layout plane in a second manner, the first manner includes passing in from a first surface of the layout plane and passing out from a second surface of the layout plane, and the second manner includes passing in from the second surface and passing out from the first surface.

According to the technical solution provided in the first aspect, because a direction of the first magnetic field formed by the first sub-coil is different from a direction of the second magnetic field formed by the second sub-coil, and the first magnetic field and the second magnetic field pass through the layout plane in the different manners, the magnetic fields in the two directions at least partially cancel each other. This can suppress an interference magnetic field on the premise that a voltage or impedance conversion function is effectively provided.

In a possible implementation solution, the first sub-coil is coupled to the second sub-coil by using M cross structures, the first sub-coil surrounds a first area, the second sub-coil surrounds a second area, and a first projection of the first area on the layout plane does not overlap a second projection of the second area on the layout plane, where M is an odd number greater than 0. Optionally, M is equal to 1, to reduce implementation complexity. To be specific, the first sub-coil is coupled to the second sub-coil by using a common cross structure or a single cross structure. According to the foregoing technical solution, along a direction perpendicular to the layout plane, the first coil forms an Arabic numeral "8" shape, so that the direction of the first magnetic field formed by the first sub-coil is different from the direction of the second magnetic field formed by the second sub-coil, thereby generating the magnetic fields in the two directions that can cancel each other.

In a possible implementation solution, the first sub-coil is coupled to the second sub-coil by using a non-cross structure, the first sub-coil surrounds a first area, the second sub-coil surrounds a second area, and a first projection of the first area on the layout plane overlaps a second projection of the second area on the layout plane. According to the foregoing technical solution, because there is the non-cross structure, the direction of the first magnetic field formed by the first sub-coil is different from the direction of the second magnetic field formed by the second sub-coil, thereby generating the magnetic fields in the two directions that can cancel each other. In another alternative implementation, the non-cross structure may be replaced with N cross structures, where N is an even number greater than 0. An effect similar to that of the non-cross structure is achieved by using even times of cross structures. Further, one of the first projection and the second projection may encircle the other.

In a possible implementation solution, a first plane formed by the first area and a second plane formed by the second area are a same plane or planes parallel to each other. In this design, the direction of the first magnetic field generated by the first sub-coil is opposite to the direction of the second magnetic field generated by the second sub-coil. This helps the first magnetic field and the second magnetic field cancel each other, and fully suppresses an interference magnetic field. Optionally, the second plane may be substantially parallel to the layout plane. Optionally, a size of the first sub-coil is approximately equal to a size of the second sub-coil.

In another possible implementation solution, the plurality of sub-coils further include a third sub-coil, the third sub-coil is coupled to either the first sub-coil or the second sub-coil by using a cross structure, the third sub-coil surrounds a third area, and a third projection of the third area on the layout plane overlaps neither the first projection nor the second projection. In this implementation, the first sub-coil, the second sub-coil, and the third sub-coil are equivalent to a plurality of Arabic numeral "8"s that are sequentially coupled by using the cross structure, thereby extending application structures of the transformer and effectively suppressing an interference magnetic field.

In another possible implementation solution, the plurality of sub-coils further include a fourth sub-coil, the fourth sub-coil is coupled to either the first sub-coil or the second sub-coil by using a cross structure, the fourth sub-coil surrounds a fourth area, and a fourth projection of the fourth area on the layout plane overlaps at least one of the first projection and the second projection. In this implementation, any two sub-coils in the plurality of sub-coils may form an Arabic numeral "8" shape, and the Arabic numeral "8" shape is used in combination with a structure in the current system, to achieve a technical effect similar to that of the transformer provided in the first aspect.

In another possible implementation solution, the first coil further includes a first port and a second port, and the second coil includes a third port and a fourth port. The first port and the second port point to a first port direction from the perspective perpendicular to the layout plane, the third port and the fourth port point to a second port direction from the perspective, and the first port direction is the same as or different from the second port direction. Optionally, in a typical application scenario, the first port direction is the same as or opposite to the second port direction, thereby reducing difficulty in a layout design and a layout of a plurality of ports.

In another possible implementation solution, the second coil and the first coil have a same structure or different structures. For the second coil, there may be a plurality of possible variations of a structure of the second coil. Optionally, in a typical application scenario, the structure of the second coil is different from that of the first coil. For example, the second coil does not include a sub-coil, and may be a single coil. For another example, the second coil may include a plurality of sub-coils that are coupled by using a cross structure, but the plurality of sub-coils do not form an Arabic numeral "8" shape, but form a spiral structure in the current system. For another example, when the second coil and the first coil have a same structure, a size of the second coil may be different from that of the first coil. Implementations of various extensions of the second coil do not affect implementation of the technical solution.

In another possible implementation solution, the plurality of sub-coils in the first coil surround a fifth area, the second coil surrounds a sixth area, and a fifth projection of the fifth area on the layout plane at least partially overlaps a sixth projection of the sixth area on the layout plane. Optionally, the fifth projection and the sixth projection have a smaller overlapping area, overlapping capacitance formed between the first coil and the second coil is smaller. On the contrary, when the fifth projection and the sixth projection have a larger overlapping area, overlapping capacitance is larger. To reduce adverse impact caused by overlapping capacitance, an area of an overlapping area may be less than or equal to half of an area the fifth projection.

In another possible implementation solution, a projection of the first coil on the layout plane at least partially overlaps a projection of the second coil on the layout plane. Optionally, the projection of the first coil on the layout plane may completely overlap the projection of the second coil on the layout plane. In this case, the first coil and the second coil are two same coils.

In another possible implementation solution, the transformer is located on a semiconductor chip, and either the first coil or the second coil is disposed on one or more layers of the semiconductor chip.

A second aspect of this application provides a circuit system. The circuit system includes the transformer in any one of the first aspect or the possible implementation solutions of the first aspect.

In a possible implementation solution, the circuit system further includes a first circuit unit and a second circuit unit. The first circuit unit is coupled to the first coil by using at least one of the first port and the second port. The second circuit unit is coupled to the second coil by using at least one of the third port and the fourth port. Optionally, the first circuit unit or the second circuit unit may be coupled in a single-ended manner or differentially coupled to the transformer. For example, when the first circuit unit is coupled to the first coil by using the first port, the second port is grounded or is connected to another fixed voltage, to implement single-ended coupling. When the second circuit unit is coupled to the second coil by using the third port, the fourth port is grounded or is connected to another fixed voltage, to implement single-ended coupling.

Optionally, the first circuit unit is a front-stage unit of the transformer, and the second circuit unit is a latter-stage unit of the transformer. The first port and the second port are input ports of the transformer, and the third port and the fourth port are output ports of the transformer. Otherwise, the first circuit unit is a latter-stage unit of the transformer, and the second circuit unit is a front-stage unit of the transformer. The first port and the second port are output ports of the transformer, and the third port and the fourth port are input ports of the transformer.

In a possible implementation solution, at least one of the first circuit unit and the second circuit unit may be integrated with the transformer into a same semiconductor chip. In this case, the layout plane belongs to the semiconductor chip. The transformer helps suppress an interference magnetic field, achieving good performance. Compared with a discrete device, the transformer achieves a better effect in an integrated solution.

In another possible implementation solution, the first circuit unit and the second circuit unit are radio frequency circuit units. The transformer is particularly suitable for a high frequency or radio frequency solution. For example, the circuit system is a radio frequency transceiver.

In another possible implementation solution, the circuit system includes an oscillator system.

The foregoing aspects or possible implementation solutions of this application are clearer and more comprehensible in descriptions of the following embodiments.

BRIEF DESCRIPTION OF THE DRAWINGS

FIG. 13 is a schematic structural diagram of a layout of another transformer according to an embodiment of this application;

FIG. 14 is a schematic diagram of simulation results of a transformer and a conventional transformer according to an embodiment of this application;

FIG. 15 is a schematic structural diagram of a layout of a coil in another transformer according to an embodiment of this application;

DETAILED DESCRIPTION OF ILLUSTRATIVE EMBODIMENTS

To make the technical solutions in the embodiments of this application more comprehensible, the following describes the technical solutions in the embodiments of this application with reference to the accompanying drawings in the embodiments of this application. Definitely, the described embodiments are merely some but not all of the embodiments of this application. In the embodiments of the specification, claims, and accompanying drawings of this application, the terms "first", "second", "third" and so on are intended to distinguish between similar objects but do not necessarily indicate a specific order or sequence. In addition, the term "include" and any variation thereof are intended to cover non-exclusive inclusion, for example, a series of modules or units are included.

Figure 2:
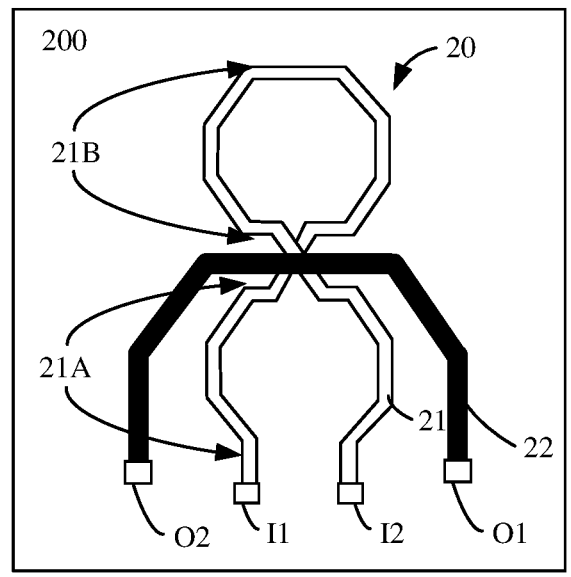
FIG. 2 is a schematic structural diagram of a layout of a transformer according to an embodiment of this application.

FIG. 2 is a schematic structural diagram of a layout of a transformer 20 according to an embodiment of this application. The transformer 20 is located in a circuit system. Along a direction perpendicular to a layout plane 200, that is, from the perspective of a top view, the layout plane 200 includes the transformer 20. The layout plane 200 may be a reference plane for observing a layout design of the circuit system. For example, the layout plane 200 is a surface of a chip or a circuit board on which the circuit system is located or a plane parallel to the surface. The layout design is a structural layout of the circuit system on the chip or the circuit board from the perspective of the top view. The transformer 20 includes a first coil 21 and a second coil 22. The first coil 21 includes a first port I1 and a second port I2, and a current may be transferred between the first port I1 and the second port I2 to pass through the first coil 21. The second coil 22 includes a third port O1 and a fourth port O2, and a current may be transferred between the third port O1 and the fourth port O2 to pass through the second coil 22. The first coil 21 is magnetically or inductively coupled to the second coil 22. The magnetic coupling makes a magnetic field of the first coil 21 interact with a magnetic field of the second coil 22. The two coils implement voltage, current, or impedance conversion by using an electromagnetic mutual inductance effect. One of the two coils converts an electrical signal before voltage transformation into a magnetic signal through electromagnetic induction, and converts the magnetic signal into a magnetic signal of the other coil through magnetic coupling between the two coils. The other coil converts the converted magnetic signal into an electrical signal after voltage transformation through magneto-electric induction. Usually, two adjacent coils produce a magnetic coupling effect, and two closer coils produce a stronger magnetic coupling effect. Either of the foregoing two coils may be made by a metal wire, and a metal may be specifically a conductive material, such as copper, aluminum, or silver.

Using FIG. 2 as an example, the first coil 21 may be a primary coil, and the first port I1 and the second port I2 are used as input ports of the transformer 20. In this case, the second coil 22 is a secondary coil, and the third port O1 and the fourth port O2 are output ports of the transformer 20. Alternatively, the first coil 21 may be a secondary coil, and the second coil 22 is a primary coil. In this case, the third port O1 and the fourth port O2 are input ports, and the first port I1 and the second port I2 are output ports. It should be noted that the input port and the output port are merely port names. In actual application, each port may be selectively used as an input terminal or an output terminal of a signal, depending on an application mode of the transformer 20.

Figure 3:
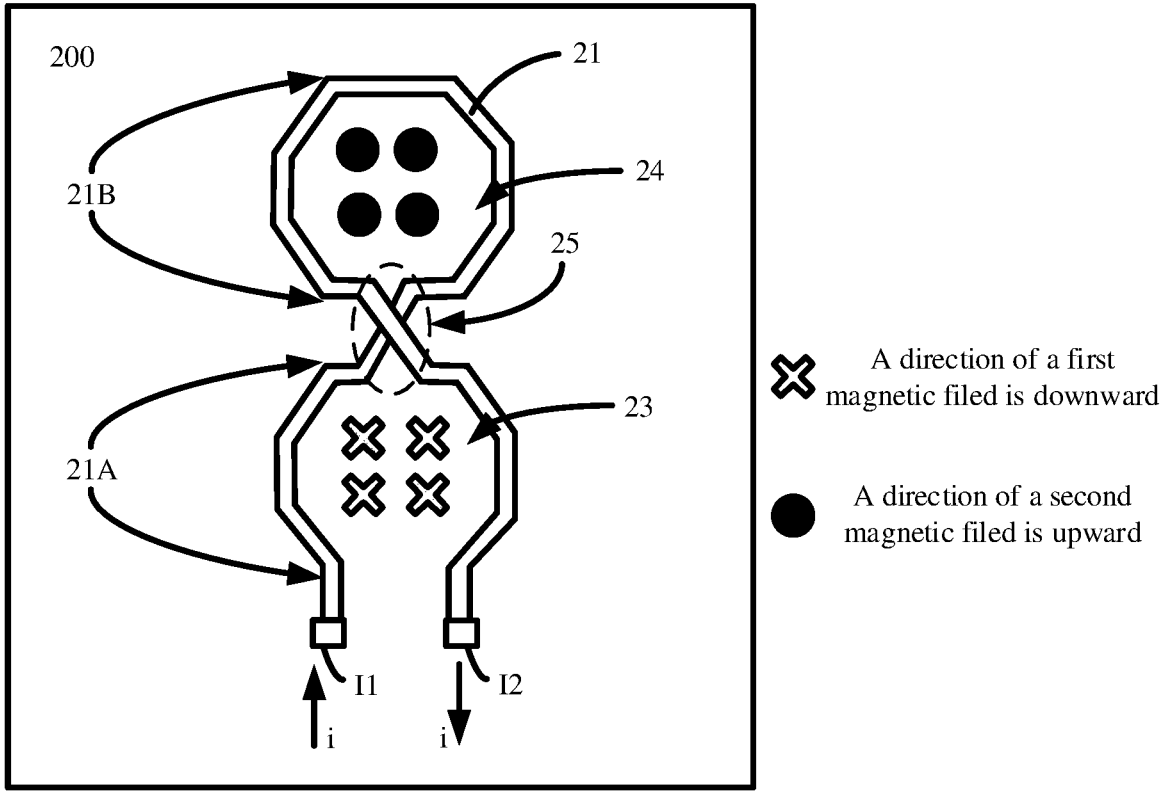
FIG. 3 is a schematic structural diagram of a layout of a coil in a transformer according to an embodiment of this application.

In FIG. 2, the first coil 21 further includes a first sub-coil 21A and a second sub-coil 21B that are coupled by using a cross structure. FIG. 3 is a schematic structural diagram of a layout of the first coil 21 along the direction perpendicular to the layout plane 200. A junction between the first sub-coil 21A and the second sub-coil 21B has a cross structure 25, and the cross structure 25 is described in more detail in subsequent embodiments and FIG. 16. The first sub-coil 21A surrounds a first area 23, and the second sub-coil 21B surrounds a second area 24. Different from that a transformer in the current system includes a spiral coil structure, in FIG. 2 and FIG. 3, the first coil 21 in the transformer 20 forms an Arabic numeral "8" shape or a twist structure, so that a first projection of the first area 23 on the layout plane 200 of the transformer 20 does not overlap a second projection of the second area 24 on the layout plane 200.

As shown in FIG. 3, it is assumed that a current i flows in from the first port I1 and flows out from the second port I2. In this design, a direction of a first magnetic field formed by the first sub-coil 21A is different from a direction of a second magnetic field formed by the second sub-coil 21B. In FIG.

3, the direction of the first magnetic field is downward from the perspective of the top view, and the direction of the second magnetic field is upward from the perspective of the top view. In this design, the first magnetic field formed by the first sub-coil 21A at least partially cancels the second magnetic field formed by the second sub-coil 21B. On the premise that a voltage transformation function is effectively provided, this helps suppress generation of an interference magnetic field, achieving an effect that is not available in the current system.

Figure 4:
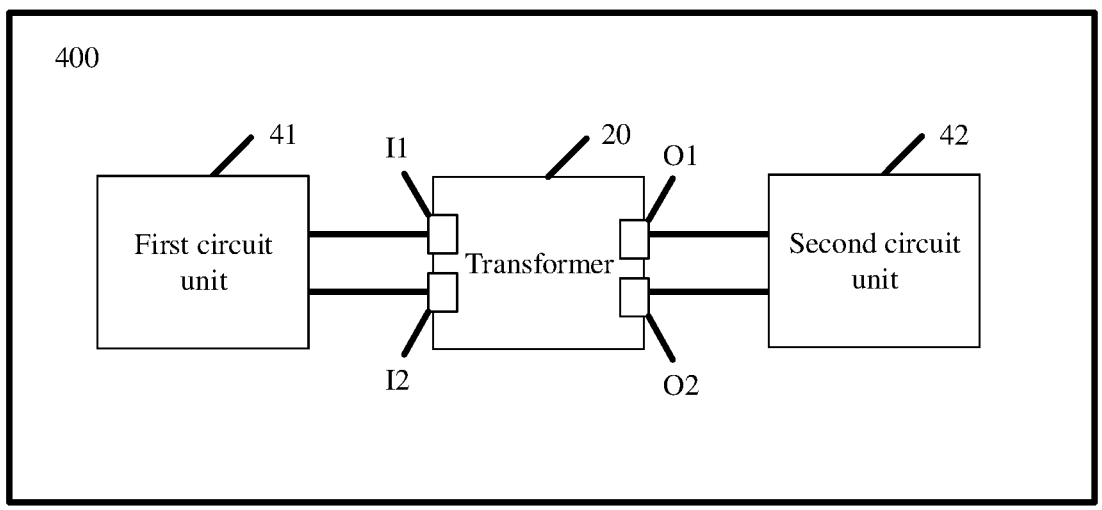
FIG. 4 is a schematic circuit diagram of a circuit system according to an embodiment of this application.

FIG. 4 is a schematic circuit diagram of a circuit system 400 according to an embodiment of this application. The circuit system 400 includes a first circuit unit 41, a second circuit unit 42, and the transformer 20 mentioned above. However, the complete circuit system 400 is not shown on the layout plane 200. In the circuit system 400, the first circuit unit 41 is coupled to the first coil 21 in the transformer 20 by using at least one of the first port I1 and the second port I2 in the transformer 20. The second circuit unit 42 is coupled to the second coil 22 in the transformer 20 by using at least one of the third port O1 and the fourth port O2. Either the first circuit unit 41 or the second circuit unit 42 is a front-stage unit, of the transformer 20, that provides an input signal for the transformer 20, and the other is a latter-stage unit, of the transformer 20, that receives an output signal from the transformer 20. For example, when the first circuit unit 41 is a front-stage unit, and the second circuit unit 42 is a latter-stage unit, the first port I1 and the second port I2 are input ports of the transformer 20, and the third port O1 and the fourth port O2 are output ports of the transformer 20; and when the first circuit unit 41 is a latter-stage unit, and the second circuit unit 42 is a front-stage unit, the first port I1 and the second port I2 are output ports of the transformer 20, and the third port O1 and the fourth port O2 are input ports of the transformer 20.

Figure 5:
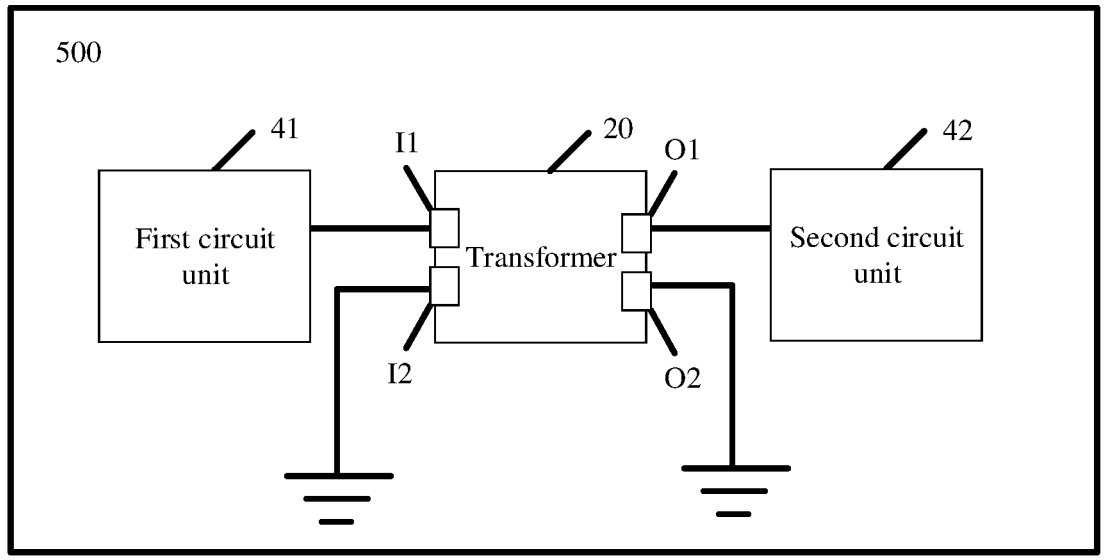
FIG. 5 is a schematic circuit diagram of another circuit system according to an embodiment of this application.

In FIG. 4, both the first circuit unit 41 and the second circuit unit 42 are differentially coupled to the transformer 20. Therefore, the transformer 20 may transfer a differential signal to the first circuit unit 41 and the second circuit unit 42. Alternatively, at least one of the first circuit unit 41 and the second circuit unit 42 may be coupled to the transformer 20 in a single-ended manner. For example, FIG. 5 is a schematic circuit diagram of another circuit system 500. Different from FIG. 4, when the first circuit unit 41 is coupled to the first coil 21 in the transformer 20 by using the first port I1, the second port I2 may be grounded or connected to another fixed voltage, to implement single-ended coupling and transfer a single-ended signal by using the first port I1. When the second circuit unit 42 is coupled to the second coil 22 by using the third port O1, the fourth port O2 is grounded or is connected to another fixed voltage, to implement single-ended coupling and transfer a single-ended signal by using the third port O1.

In FIG. 4 or FIG. 5, the circuit system 400 or 500 may include one or more semiconductor chips or printed circuit boards (PCB). Correspondingly, the layout plane 200 may be a layout plane of the semiconductor chip or the printed circuit board. The following embodiments provide descriptions by using an example in which a circuit system is implemented by using a semiconductor chip. The semiconductor chip is also referred to as a chip, and is an integrated circuit system implemented by using an integrated circuit technology. For example, at least one of the first circuit unit 41 and the second circuit unit 42 may be integrated with the transformer 20 into a same semiconductor chip. In this case, the layout plane 200 mentioned in the foregoing embodiments is used to show a layout design of the same semiconductor chip. Because different devices have a closer distance in an integrated semiconductor chip, system performance can be improved by using the solution in this embodiment. Compared with a discrete device system by using a PCB technology, in the integrated semiconductor chip, the transformer 20 has a better effect of suppressing an interference magnetic field. The following descriptions are provided by using an example in which the circuit system 400 or 500 is implemented on a semiconductor chip.

Optionally, the transformer 20 may be applied to processing various signals, for example, an analog signal, a high-frequency signal, or a radio frequency signal. Because a high-frequency or radio frequency technology is more sensitive to an interference magnetic field, when the transformer 20 is applied to the high frequency or radio frequency technology a suppression effect is more prominent. For example, the first circuit unit 41 and the second circuit unit 42 are radio frequency circuit units, and the circuit system 400 or 500 is a radio frequency transceiver. For example, the first circuit unit 41 is an amplifier and is used as a front-stage unit, and the second circuit unit 42 is a frequency mixer and is used as a latter-stage unit. In this case, the transformer 20, the first circuit unit 41, and the second circuit unit 42 are jointly located on a receiver channel, and are configured together to amplify a received signal and implement impedance transformation and down-mixing processing.

The foregoing example is merely an example of an application scenario of the transformer 20. In addition to being applied to the circuit system 400 or 500 shown in FIG. 4 or FIG. 5, the transformer 20 may be applied to another circuit system, for example, an oscillator system. The oscillator system may include a high-frequency oscillator or a radio frequency oscillator that works at a high frequency. The oscillator system may be specifically implemented by using a plurality of structures. Oscillators of various structures have been described in the current system, and details are not described in this embodiment.

Figure 6:
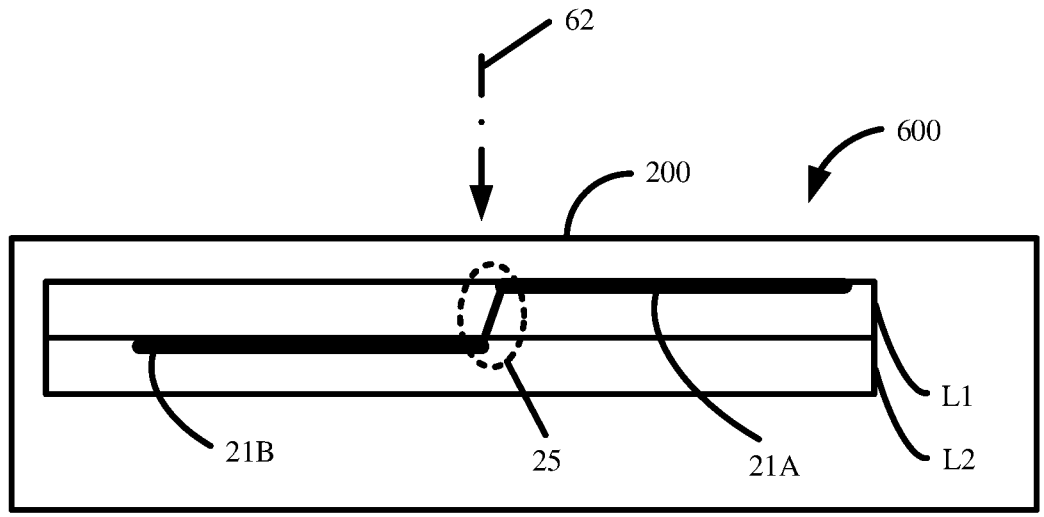
FIG. 6 is a side view of a simplified structure of a semiconductor chip including a transformer according to an embodiment of this application.

In FIG. 6, a side view of a simplified structure of a semiconductor chip 600 is used as an example for description. Different from the top view in FIG. 2 or FIG. 3, the semiconductor chip 600 may include a plurality of layers from the side view. In FIG. 6, only two layers L1 and L2 are used as an example for description rather than an actual limitation. In this embodiment of this application, the layout plane 200 is a reference plane for observing a layout design of the semiconductor chip 600. For example, the layout plane 200 may be an upper surface of the semiconductor chip 600 or any plane parallel to an upper surface of the semiconductor chip 600. Along a direction 62 perpendicular to the layout plane 200, the perspective of the top view of FIG. 2 or FIG. 3 is formed. In the side view of FIG. 6, only the first sub-coil 21A and the second sub-coil 21B are shown, and other parts are omitted. For the first coil 21, the first sub-coil 21A may be located at the layer L1, and the second sub-coil 21B is located at the layer L2. The two layers L1 and L2 may be adjacent or not adjacent, and positions of the two layers may also be interchanged. With reference to FIG. 3, the cross structure 25 may be formed in the side view of FIG. 6 by using a through via that passes through the two layers L1 and L2.

Different from that shown in FIG. 6, in another possible implementation, the first sub-coil 21A and the second sub-coil 21B are located at a same layer of the semiconductor chip 600, and the cross structure 25 may be implemented by using a through via that passes through different layers or in another cross-connection manner. It may be understood that one or more layers of a semiconductor chip are usually parallel to the layout plane 200. Therefore, both the first area 23 surrounded by the first sub-coil 21A and the second area 24 surrounded by the second sub-coil 21B are parallel to the layout plane 200. Alternatively, one or more layers of the semiconductor chip, for example, the layers L1 and L2, may not be parallel to the layout plane 200; or the layers L1 and L2 are not parallel to each other. However, provided that the first projection of the first area 23 on the layout plane 200 does not overlap the second projection of the second area 24 on the layout plane 200, a structure similar to the solution in FIG. 6 may still be formed and belongs to an equivalent or a variant of this embodiment.

For example, the first area 23, the second area 24, and the layout plane may be designed to be substantially parallel. For example, there may be an included angle between different planes, and the included angle is not absolutely 0, but the included angle is less than a preset threshold. In this case, it may be considered that these planes are substantially parallel. The preset threshold may be set by a person skilled in the art based on experience. For another example, each layer of the semiconductor chip may not be an absolute plane, but is similar to a plane. This does not affect implementation of this solution. With reference to FIG. 2, FIG. 3, and FIG. 6, if a plane on which the first area 23 is located is used as a reference, that is, the plane on which the first area 23 is located is used as the layout plane 200, the second projection of the second area 24 does not overlap the first projection of the first area 23 from the perspective of the top view (because the plane on which the first area 23 is located is used as a reference, the first projection is the first area 23 itself in this case), thereby forming a twist structure or an Arabic numeral "8" structure.

It may be understood that, in FIG. 6, the first sub-coil 21A and the second sub-coil 21B both are disposed on a same layer as a whole. However, this is merely an example. Actually, any sub-coil may be alternatively disposed on different layers of the semiconductor chip 600. Regardless of whether a sub-coil is disposed on different layers, a similar effect can be achieved provided that a condition in which the first projection does not overlap the second projection and that is mentioned above is met. In FIG. 6, a first plane formed by the first area 23 surrounded by the first sub-coil 21A is parallel to a second plane formed by the second area 24 surrounded by the second sub-coil 21B. Therefore, in this design, the direction of the first magnetic field generated by the first sub-coil 21A is opposite to the direction of the second magnetic field generated by the second sub-coil 21B. This helps the first magnetic field and the second magnetic field cancel each other, fully suppresses an interference magnetic field, and achieves a better effect. To enhance a cancellation effect, a size of the first sub-coil 21A may be designed to be approximately equal to a size of the second sub-coil 21B. "Approximately equal" means that a difference between the sizes of the two coils is less than a preset threshold. The preset threshold may be set by a person skilled in the art based on a historical empirical value, a theoretical calculation value, or experimental data.

Figure 7:
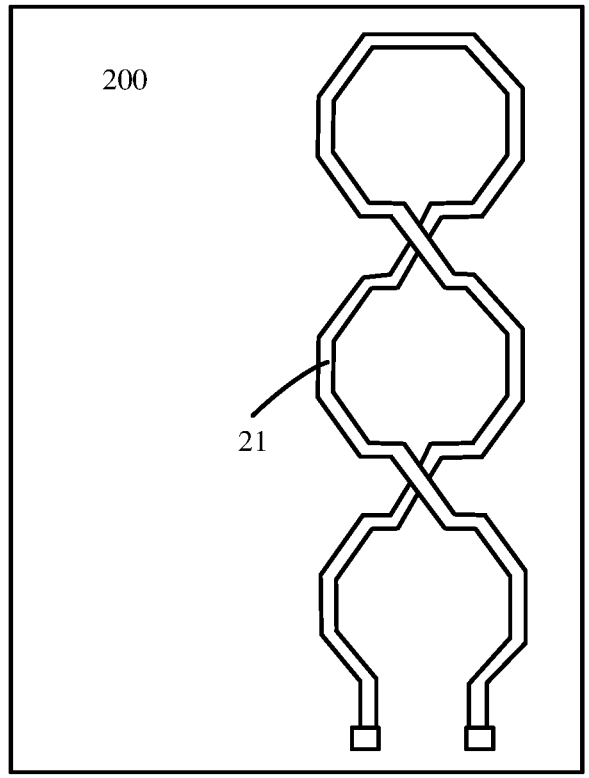
FIG. 7 is a schematic structural diagram of a layout of a coil in another transformer according to an embodiment of this application.

The structure of the first coil 21 including the two sub-coils is described in the foregoing embodiments. Alternatively, the first coil 21 may further include more sub-coils. As shown in FIG. 7, the first coil 21 includes three sub-coils that are sequentially coupled by using a cross structure, and projections of areas surrounded by the sub-coils on the layout plane 200 do not overlap with each other, to form a plurality of twist shapes or Arabic numeral "8" shapes that are sequentially connected, thereby extending application structures of the transformer, and effectively suppressing an interference magnetic field. When there are more than three sub-coils in the first coil 21, different overlapping shapes may be obtained based on the structure in FIG. 7.

Figure 8:
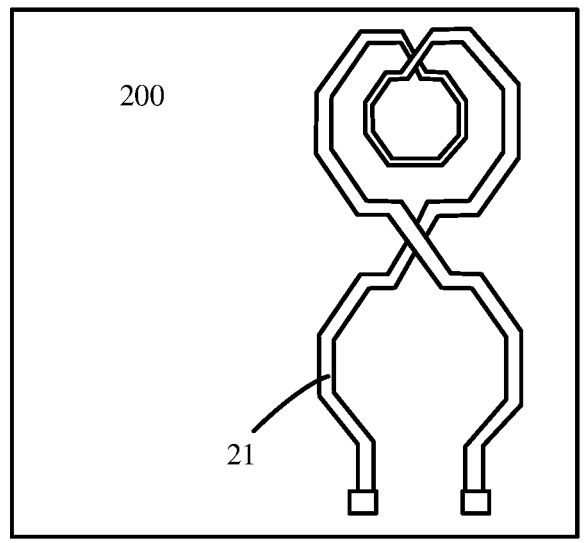
FIG. 8 is a schematic structural diagram of a layout of a coil in another transformer according to an embodiment of this application.
Figure 9:
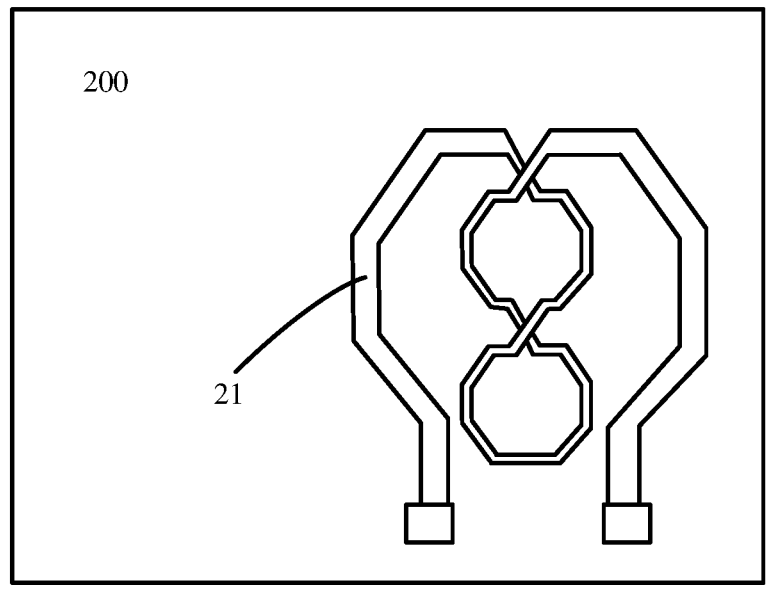
FIG. 9 is a schematic structural diagram of a layout of a coil in another transformer according to an embodiment of this application.

FIG. 8 and FIG. 9 each show other possible implementation solutions of the first coil 21. In these solutions, when a plurality of sub-coils are coupled by using a cross structure, a prior-art solution may be introduced into a connection relationship of some sub-coils. For example, referring to FIG. 8 or FIG. 9, three sub-coils included in the first coil 21 are not completely formed in Arabic numeral "8" shapes that are sequentially connected, but are partially of spiral structures in the current system, and a projection of an area surrounded by one or more of the sub-coils on the layout plane 200 may partially overlap a projection of an area surrounded by another sub-coil on the layout plane 200. It may be understood that this solution may be extended to a case in which there are more than three sub-coils. Provided that any two adjacent sub-coils in the plurality of sub-coils are formed in an Arabic numeral "8" shape or a twist shape, a similar technical effect can still be achieved even if the structure is used in combination with another prior-art structure. FIG. 8 and FIG. 9 are merely examples. During actual technical implementation, a plurality of sub-coils of Arabic numeral "8" shapes and a plurality of sub-coils of spiral structures may be combined in any manner to form a coil, so as to achieve a similar beneficial effect. This is not limited in this embodiment.

Figure 10:
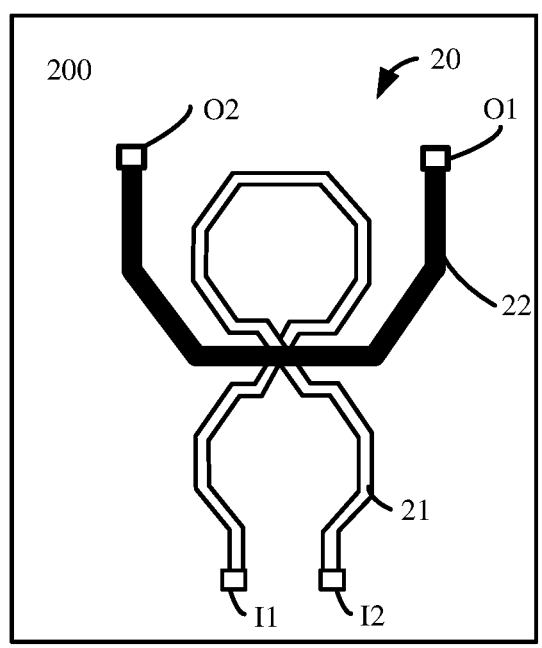
FIG. 10 is a schematic structural diagram of a layout of another transformer according to an embodiment of this application.

In addition, in the embodiment corresponding to FIG. 2, from a perspective perpendicular to the layout plane 200, that is, from the perspective of the top view, the first port I1, the second port I2, the third port O1, and the fourth port O2 all point to a same direction, for example, a downward direction in FIG. 2. In a layout design of an alternative transformer 20, as shown in FIG. 10, still from the same perspective, a direction pointed to by a first port I1 and a second port I2 may be opposite to a direction pointed to by a third port O1 and a fourth port O2, to be specific, a difference between the two directions may be shown as 180 degrees on the layout plane 200. A port direction arrangement in FIG. 2 or FIG. 10 can be used to reduce difficulty in a layout design and a layout of a plurality of ports. Certainly, alternatively, from the perspective, a difference between the direction pointed to by the first port I1 and the second port I2 and the direction pointed to by the third port O1 and the fourth port O2 may be any angle, but the two directions are not limited to being the same or opposite. Regardless of how port directions or relative positions of the two coils change, implementation of the technical solution in this embodiment is not affected. Therefore, the schematic diagram provided in this embodiment is merely for ease of understanding. Actually, arrangement directions of the first coil 21 and the second coil 22 may be flexibly designed. In addition, it should be understood that, from the perspective perpendicular to the layout plane 200, the top, bottom, left, and right are relative concepts, specifically depending on a placement position of a semiconductor chip or a printed circuit board. Regardless of how the placement position changes, various variations of the embodiments of this application without changing the essence of the technical solutions should be considered as equivalents of the embodiments of this application.

Figure 1:
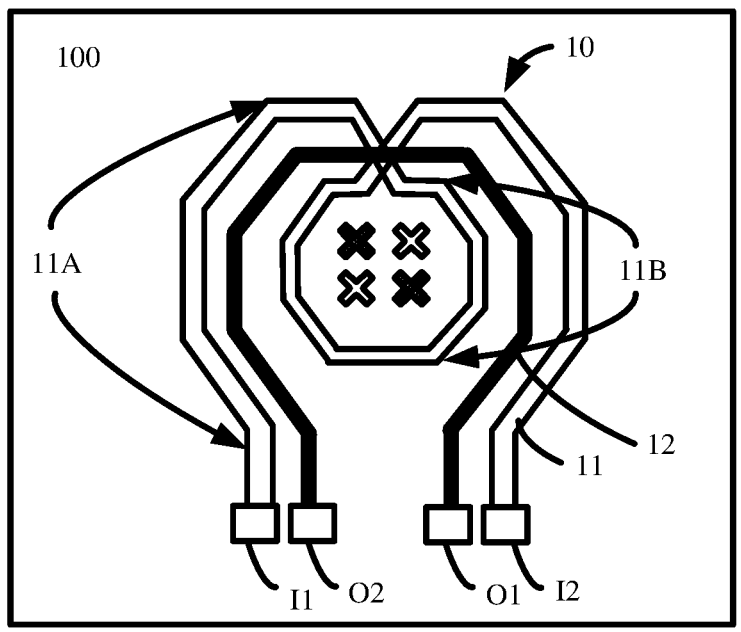
FIG. 1 is a schematic structural diagram of a layout of a transformer in the current system.

Optionally, a structure of the second coil 22 is the same as or different from a structure of the first coil 21. For the second coil 22, there may be a plurality of possible variations of the structure of the second coil 22. For example, in FIG. 2 or FIG. 10, the structure of the second coil 22 is different from that of the first coil 21, and there is no plurality of sub-coils inside the second coil 22, but the second coil 22 is a single coil. For another example, the second coil 22 may also have a cross structure. However, two sub-coils forming the cross structure in the second coil 22 do not form an Arabic numeral "8" shape, but form a spiral structure in the current system, and reference may be made to the coil 11 in FIG. 1.

Figure 11:
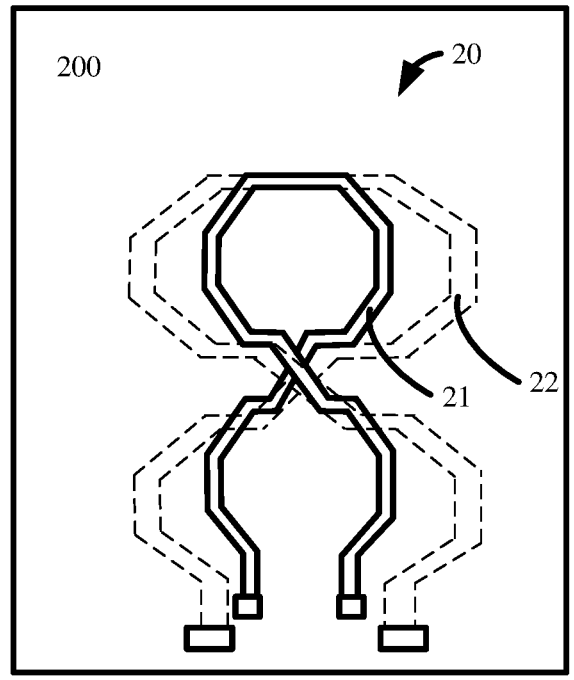
FIG. 11 is a schematic structural diagram of a layout of another transformer according to an embodiment of this application.
Figure 12:
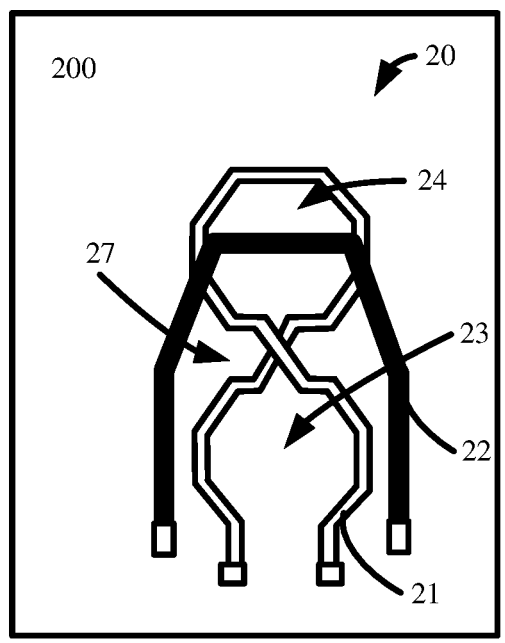
FIG. 12 is a schematic structural diagram of another transformer according to an embodiment of this application.

FIG. 11 to FIG. 13 are schematic structural diagrams of other alternative layouts of the transformer 20. A structure of the second coil 22 may have a plurality of variations. Appropriate changes in the structure and a size of the second coil 22 all belong to various extensions of this embodiment. For example, in FIG. 11, the structure of the second coil 22 is similar to the structure of the first coil 21, and the size of the second coil 22 is different from the size of the first coil 21, so that projections of the two coils on the layout plane 200 do not completely overlap. Different from that the second coil 22 in other figures is represented by using a black coil, the second coil 22 in FIG. 11 is marked in dashed lines, to clearly show overlapping parts of different coils.

Different from FIG. 11, in an alternative possible implementation, projections of two coils on the layout plane 200 may not overlap at all. To be specific, from a top view perpendicular to the layout plane 200, different coils are independent. Even so, there is still magnetic coupling. This does not affect a working principle of this embodiment. However, when a distance between the two coils is farther, a magnetic coupling effect is weakened.

Alternatively, different from FIG. 11, in another solution, the second coil 22 and the first coil 21 may be designed to be completely the same, that is, have a same structure and a same size. In this case, a projection of the second coil 22 on the layout plane 200 completely overlaps a projection of the first coil 21 on the layout plane 200. From the perspective of the top view, a metal wire forming the first coil 21 and a metal wire forming the second coil 22 completely overlap on the layout plane 200. Regardless of the area of an overlapping region of projections of the second coil 22 and the first coil 21 on the layout plane 200, an interference magnetic field can be suppressed.

The second coil 22 in FIG. 12 is similar to the second coil 22 in FIG. 2, and a difference between the two second coils 22 lies in that, from the top view, the second coil 22 in FIG. 2 covers only the first sub-coil 21A in the first coil 21, while the second coil 22 in FIG. 12 further covers a part of the second sub-coil 21B in the first coil 21. Therefore, it is assumed that the plurality of sub-coils in the first coil 21 surround a fifth area, and the fifth area may specifically include the first area 23 and the second area 24 shown in FIG. 3; and assuming that the second coil surrounds a sixth area 27, a fifth projection of the fifth area on the layout plane 200 may at least partially overlap a sixth projection of the sixth area 27 on the layout plane 200. Optionally, when the fifth projection and the sixth projection 27 have a smaller overlapping area, for example, an area shown in FIG. 2, overlapping capacitance formed between the first coil 21 and the second coil 22 is smaller. On the contrary, when the fifth projection and the sixth projection 27 have a larger overlapping area, for example, an area shown in FIG. 12, overlapping capacitance is larger. Because overlapping capacitance causes adverse impact, an area of an overlapping area may be designed to be less than or equal to half of an area of the fifth projection, to reduce the overlapping capacitance.

In addition, the first coil 21 and the second coil 22 may be designed to be completely the same, or may be partially the same. To be specific, projections on the layout plane 200 may partially overlap from the perspective perpendicular to the layout plane 200. The second coil 22 in FIG. 13 at least partially overlaps the first sub-coil 21A in the first coil 21 from the top view. For example, if the first sub-coil 21A and the second sub-coil 21B have a same size, projections of the second coil 22 and the first sub-coil 21A on the layout plane 200 completely overlap. In this case, an overlapping area between the fifth projection and the sixth projection 27 may be equal to half of the area of the fifth projection.

During actual implementation, either the first coil 21 or the second coil 22 in the transformer 20 may be disposed on one or more layers of the semiconductor chip, and any coil or a sub-coil in any coil may be disposed on one or more layers above or below the other coil. For example, the entire second coil 22 may be located at one layer, while the first coil 21 may pass through a plurality of layers as shown in FIG. 6. When a coil is disposed on or passes through a plurality of layers, parts of the coil that are located at different layers may be coupled by using at least one through via.

In addition to suppression of an interference magnetic field, the transformer provided in this embodiment may further have a high-quality factor and may be designed to meet a requirement of a small inductance value, so as to implement excellent performance in the radio frequency or high frequency field. For example, any coil in the transformer may be implemented by using a metal material. It may be understood that although a plurality of sub-coils included in any coil in this embodiment, for example, the first sub-coil 21A and the second sub-coil 21B in the first coil 21, are described as different independent sub-coils, this is merely intended to describe a structure of the coil more clearly, but is not intended to limit an implementation of this embodiment. In a typical implementation solution, the coil may be designed or made as a whole. To be specific, a plurality of sub-coils may be made by using a same technology or material, for example, a whole made by using a continuous metal conductor. Alternatively, different parts of the coil may use different technologies or materials. This is not limited in this embodiment.

In related accompanying drawings of this embodiment, any coil and a port corresponding to the coil are marked by using clear reference numerals. For example, the first coil 21 includes the first sub-coil 21A, the second sub-coil 21B, the first port I1, and the second port I2. It should be noted that during actual implementation, there may be no clear boundary between the coil and the corresponding port. For example, as shown in FIG. 15, the first sub-coil 21A, the second sub-coil 21B, the first port I1, and the second port I2 may exist as a whole that is made by using a same process or material, for example, by using a continuous metal conductor. Because a port is configured to connect another device other than a coil, when the coil is coupled to the another device, a coupling part may be considered as a port. Therefore, the port mentioned in this embodiment should be understood as a coupling part or a connection part in a broad sense. Further, a shape of the port may have a plurality of variations or directions. This is not limited in this embodiment.

To describe the transformer mentioned in this embodiment, the following provides only an example of a parameter design of the transformer 20. It is assumed that parameter requirements for the transformer 20 are: An inductance value of a first coil 21 is approximately 220 pH (microhenry), an inductance value of a second coil 22 is approximately 80 pH, a coupling coefficient is approximately 0.7, and the first coil 21 and the second coil 22 each need a relatively high quality factor. For the proposed requirements, according to a same semiconductor manufacturing technology, the conventional transformer 10 shown in FIG. 1 and the transformer 20 in the embodiments of this application may be simulated by using an electromagnetic field simulation tool, and a frequency for the simulation is 12 GHz. Simulation results are shown in FIG. 14: The conventional transformer 10 has a larger inductance value, and a requirement of a small inductance value and a design requirement for an oscillation frequency of a high-frequency oscillator cannot be met easily. However, an inductance value of the transformer 20 may be smaller. In addition, a quality factor Q of the transformer 20 is also higher.

Figure 16:
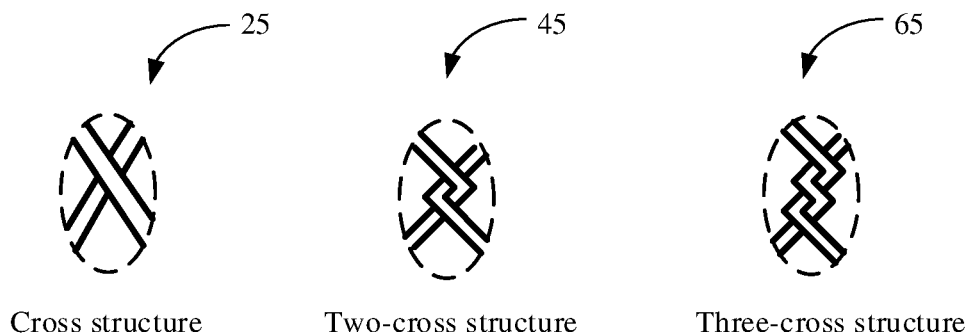
FIG. 16 is a schematic diagram of comparison between a cross structure and multiple cross structures according to an embodiment of this application.

FIG. 16 is specifically a schematic diagram of comparison between coupling by using a cross structure and coupling by using a multiple cross structures. In a structure 25 on the left, two metal wires used to form a coil with one cross, that is, form a cross structure, so that magnetic fields of two sub-coils coupled by using the cross structure 25 have different directions. The cross structure may also be referred to as a single cross structure or a common cross structure. In a structure 45 in the middle, two metal wires used to form a coil with two times of crosses, so that magnetic fields of two sub-coils coupled by using the structure 45 have a same direction. In a structure 65 on the right, two metal wires for forming a coil cross three times, so that magnetic fields of two sub-coils coupled by using the cross structure 65 have different directions. It may be understood that, when two sub-coils cross an odd number of times to implement coupling, both the two sub-coils may be configured to implement the coil structure in FIG. 2 or FIG. 3 and other corresponding embodiments, so that magnetic fields of the two sub-coils have different directions. In other words, in FIG. 2 or FIG. 3 and the other corresponding embodiments, the first sub-coil 21A and the second sub-coil 21B may be coupled by using M cross structures, where M is an odd number greater than 0. In FIG. 2 or FIG. 3 and the other corresponding embodiments, only the single cross structure or the common cross structure is used as an example for description.

Figure 17:
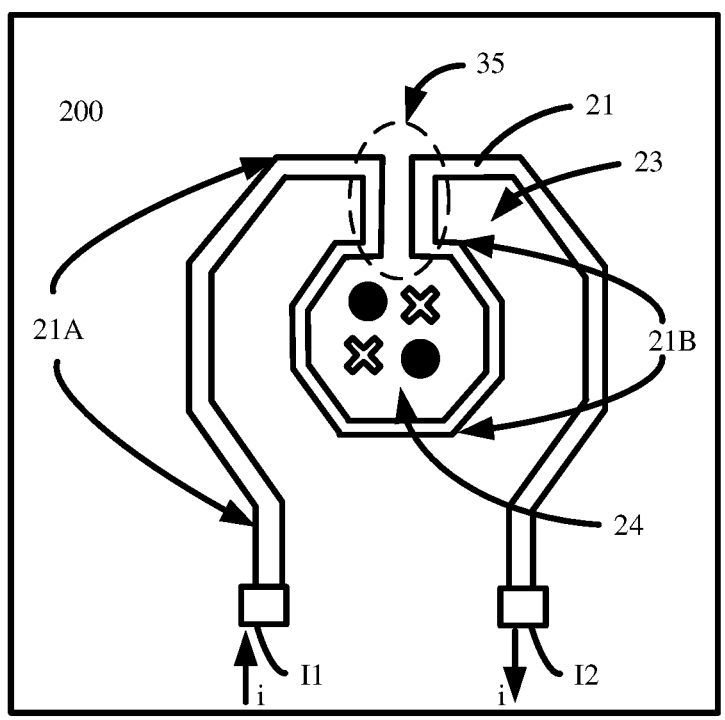
FIG. 17 is a schematic structural diagram of a layout of a coil in another transformer according to an embodiment of this application.

FIG. 17 is a schematic structural diagram of a layout of a coil in another transformer according to this application. Different from the foregoing embodiments, two sub-coils in this embodiment do not use the Arabic numeral "8" shape mentioned in the foregoing embodiments, but are coupled by using a non-cross structure 35, that is, are directly coupled. Through direct coupling, a projection of the first area 23 surrounded by the first sub-coil 21A on the layout plane 200 overlaps a second projection of the first area 24 surrounded by the first sub-coil 21B on the layout plane 200. Specifically, in FIG. 17, the second area 24 is included in the first area 23. Because there is the non-cross structure 35, a direction of a first magnetic field formed by the first sub-coil 21A is downward from the perspective of a top view, and a direction of a second magnetic field formed by the second sub-coil 21B is upward from the perspective of the top view.

As a variation of the embodiment corresponding to FIG. 17, the non-cross structure 35 may be replaced with two cross structures located in the middle in FIG. 16. If a junction has two times of crosses, an effect is the same as that of direct coupling. In this case, magnetic fields generated by different sub-coils are still in opposite directions, to implement magnetic field cancellation. Extensively, the non-cross structure 35 may be replaced with N cross structures, where N is an even number greater than 0. Similar beneficial effects can be achieved by using the non-cross structure 35 and the N cross structures.

Figure 18:
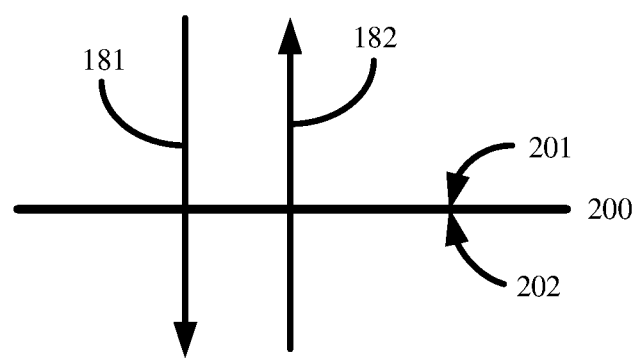
FIG. 18 is a schematic illustrative diagram of a direction of a magnetic field generated by a coil in a transformer according to an embodiment of this application.

The following further describes the beneficial effects of the embodiments of the present invention with reference to FIG. 18. As mentioned in the foregoing embodiments, a plurality of sub-coils in one coil may be disposed on different layers of the semiconductor chip 600, a plurality of coils may alternatively be located at the different layers, and the different layers may not be strictly parallel to the layout plane 200. However, regardless of a structure in the foregoing embodiments that is used by the plurality of sub-coils, partial magnetic field cancellation can be implemented to resist interference, provided that directions of magnetic fields formed by two sub-coils are different relative to the layout plane 200. FIG. 18 is a side view for the semiconductor chip 600, including the layout plane 200. When a coil described in the foregoing embodiments is used, a first magnetic field 181 formed by a sub-coil in the coil passes through the layout plane 200 of the transformer in a first manner, and a second magnetic field 182 formed by another sub-coil in the coil passes through the layout plane 200 in a second manner. In the first manner, the first magnetic field 181 passes in from a first surface 201 of the layout plane 200 and passes out from a second surface 202 of the layout plane 200. A direction of the first magnetic field 181 is downward from the perspective of a top view. In the second manner, the second magnetic field 182 passes in from the second surface 202 and passes out from the first surface 201. A direction of the second magnetic field 182 is upward from the perspective of the top view.

It may be understood that a plurality of coils may be selectively included in a transformer. Any two coils that are magnetically coupled to each other may use a coil structure mentioned in the foregoing embodiments. Alternatively, only one of the two coils may use a structure in the embodiments, and the other coil uses the prior-art structure. The two coils may have a same structure or different structures. The "different" means that the two coils have completely or partially different structures. Further, any coil may include two sub-coils that generate magnetic fields in different directions, to achieve a technical effect of anti-interference. Optionally, any coil may alternatively selectively include the prior-art structure. In other words, the solution mentioned in this embodiment may be used in combination with that in the current system.

In conclusion, the foregoing embodiments are merely intended for describing the technical solutions of this application, rather than limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. A transformer, comprising:
   a first coil; and
   a second coil, wherein:
   the first coil is magnetically coupled to the second coil;
   the first coil comprises a plurality of sub-coils, the plurality of sub-coils comprise a first sub-coil and a second sub-coil, a first magnetic field formed by the first sub-coil passes through a plane of the transformer in a first manner, a second magnetic field formed by the second sub-coil passes through the plane of the transformer in a second manner, the first manner comprises passing through the plane in a first direction, the second manner comprises passing through the plane in a second direction, and the second direction is opposite from the first direction;

the first sub-coil comprises a first port of the first coil and a second port of the first coil, and the second coil comprises a third port and a fourth port;

the first port, the second port, the third port, and the fourth port are on a same side of a line separating the first sub-coil and the second sub-coil; and a third magnetic field formed by the second coil passes through the plane of the transformer in a third manner, the third manner comprises passing through the plane in a third direction, and the third direction is opposite from the first direction, wherein the first sub-coil surrounds a first area, wherein the second sub-coil surrounds a second area, wherein the second coil surrounds a third area, wherein a third projection of the third area on the plane at least partially overlaps a first projection of the first area on the plane, wherein the first port, the second port, the third port, and the fourth port are on a same side of a second line dividing the first sub-coil into a first portion and a second portion and dividing the second coil into a third portion and a fourth portion, the first portion including the first port and the second port, the third portion including the third port and the fourth port, the second line passing through a center of the first area and parallel to the line, wherein the second coil is a single coil without any sub-coil forming an additional magnetic field in a manner different from the third manner, and wherein the third projection of the third area on the plane does not overlap a second projection of the second area on the plane.

2. The transformer according to claim 1, wherein the first sub-coil is coupled to the second sub-coil by M first cross structures, and the first projection of the first area on the plane does not overlap the second projection of the second area on the plane, wherein M is an odd number greater than 0.

3. The transformer according to claim 2, wherein a first plane formed by the first area and a second plane formed by the second area are a same plane or parallel to each other.

4. The transformer according to claim 3, wherein the second plane is substantially parallel to the plane of the transformer.

5. The transformer according to claim 1, wherein the first sub-coil is coupled to the second sub-coil by N second cross structures, and the first projection of the first area on the plane overlaps the second projection of the second area on the plane, wherein N is an even number greater than 0.

6. The transformer according to claim 1, wherein:

the first port and the second port point to a first port direction from a perspective perpendicular to the plane, and the third port and the fourth port point to a second port direction from the perspective perpendicular to the plane, and the first port direction is different from the second port direction.

7. The transformer according to claim 1, wherein the second coil and the first coil have different shapes.

8. The transformer according to claim 1, wherein the plurality of sub-coils in the first coil surround a fifth area, the second coil surrounds a sixth area, and a fifth projection of the fifth area on the plane at least partially overlaps a sixth projection of the sixth area on the plane.

9. The transformer according to claim 1, wherein the transformer is located on a semiconductor chip, and the first coil or the second coil is disposed on one or more layers of the semiconductor chip.

10. A circuit system, comprising:

a transformer, wherein the transformer comprises:
 a first coil; and
 a second coil;
 wherein the first coil is magnetically coupled to the second coil;
 wherein the first coil comprises a plurality of sub-coils, the plurality of sub-coils comprise a first sub-coil and a second sub-coil, a first magnetic field formed by the first sub-coil passes through a plane of the transformer in a first manner, a second magnetic field formed by the second sub-coil passes through the plane in a second manner, the first manner comprises passing through the plane in a first direction, the second manner comprises passing through the plane in a second direction, and the second direction is opposite from the first direction;
 wherein the first sub-coil comprises a first port of the first coil and a second port of the first coil, and the second coil comprises a third port and a fourth port;
 wherein the first port, the second port, the third port, and the fourth port are on a same side of a line separating the first sub-coil and the second sub-coil; and
 a third magnetic field formed by the second coil passes through the plane of the transformer in a third manner, the third manner comprises passing through the plane in a third direction, and the third direction is opposite from the first direction,
 wherein the first sub-coil surrounds a first area, wherein the second sub-coil surrounds a second area, wherein the second coil surrounds a third area, wherein a third projection of the third area on the plane at least partially overlaps a first projection of the first area on the plane,
 wherein the first port, the second port, the third port, and the fourth port are on a same side of a second line dividing the first sub-coil into a first portion and a second portion and dividing the second coil into a third portion and a fourth portion, the first portion including the first port and the second port, the third portion including the third port and the fourth port, the second line passing through a center of the first area and parallel to the line,
 wherein the second coil is a single coil without any sub-coil forming an additional magnetic field in a manner different from the third manner, and
 wherein the third projection of the third area on the plane does not overlap a second projection of the second area on the plane.

11. The circuit system according to claim 10, wherein the circuit system further comprises an oscillator system.

12. The circuit system according to claim 10, wherein the first sub-coil is coupled to the second sub-coil by M first cross structures, and the first projection of the first area on the plane does not overlap the second projection of the second area on the plane, wherein M is an odd number greater than 0.

13. The circuit system according to claim 10, wherein:

the first port and the second port point to a first port direction from a perspective perpendicular to the plane, the third port and the fourth port point to a second port direction from the perspective perpendicular to the plane, and the first port direction is different from the second port direction.

14. The circuit system according to claim 10, wherein the third direction is a same direction as the second direction.

15. The circuit system according to claim 10, wherein the plurality of sub-coils in the first coil surround a fifth area, the second coil surrounds a sixth area, and a fifth projection of the fifth area on the plane at least partially overlaps a sixth projection of the sixth area on the plane.

16. The circuit system according to claim 10, wherein the second coil and the first coil have different shapes.

17. The circuit system according to claim 12, wherein a first plane formed by the first area and a second plane formed by the second area are a same plane or parallel to each other.

18. The circuit system according to claim 17, wherein the second plane is substantially parallel to the plane of the transformer.

\* \* \* \* \*